US005920773A

United States Patent [19]
Hafizi et al.

[11] Patent Number: 5,920,773
[45] Date of Patent: Jul. 6, 1999

[54] METHOD FOR MAKING INTEGRATED HETEROJUNCTION BIPOLAR/HIGH ELECTRON MOBILITY TRANSISTOR

[75] Inventors: Madjid Hafizi; Julia J. Brown, both of Santa Monica; William E. Stanchina, Thousand Oaks, all of Calif.

[73] Assignee: Hughes Electronics Corporation, El Segundo, Calif.

[21] Appl. No.: 08/876,277

[22] Filed: Jun. 16, 1997

[51] Int. Cl.[6] .................................................. H01L 21/338
[52] U.S. Cl. ........................ 438/170; 438/172; 438/314; 148/DIG. 72; 257/195; 257/622; 257/623
[58] Field of Search .................................... 438/170, 172, 438/314, FOR 250, FOR 214, FOR 167; 148/DIG. 72; 257/197, 618, 622, 623, 194, 195

[56] References Cited

U.S. PATENT DOCUMENTS

| | | |
|---|---|---|
| 5,049,522 | 9/1991 | Stanchina et al. . |
| 5,051,372 | 9/1991 | Sasaki ......................................... 437/5 |
| 5,166,083 | 11/1992 | Bayraktaroglu .......................... 438/172 |
| 5,213,987 | 5/1993 | Bayraktaroglu .......................... 438/170 |

FOREIGN PATENT DOCUMENTS

| | | | |
|---|---|---|---|
| 406061431 | 3/1994 | Japan | ...................................... 257/197 |
| 406207077 | 7/1994 | Japan | ...................................... 257/197 |

OTHER PUBLICATIONS

Kiziloglu, K., et al., "InP–based Mixed . . . Optoelectronic Circuits", Electronics Letters, Nov. 1997, vol. 33, Issue 24.
Streit et al., "Monolithic HEMT–HBT Integration by Selective MBE," *IEEE Transactions on Electron Devices*, vol. 42, No. 4, pp. 618–623, 1995.

*Primary Examiner*—Michael Trinh
*Assistant Examiner*—Long Pham
*Attorney, Agent, or Firm*—V. D. Duraiswamy; M. W. Sales

[57] ABSTRACT

An integrated circuit technology combines heterojunction bipolar transistors (HBTs), high electron mobility transistors (HEMTs) and other components along with interconnect metallization on a single substrate. In a preferred embodiment a flat substrate is patterned, using dry etching, to provide one or more mesas in locations which will eventually support HEMTs. A device stack including HEMT and HBT layers is built up over the substrate by molecular beam epitaxy, with the active HEMT devices located on the mesas within openings in the HBT layer. In this way the active HEMT is aligned with the HBT layer to planarize the finished integrated circuit.

14 Claims, 5 Drawing Sheets

METHOD FOR MAKING INTEGRATED HETEROJUNCTION BIPOLAR/HIGH ELECTRON MOBILITY TRANSISTOR

BACKGROUND OF THE INVENTION

1. Field of the Invention

This invention relates to mixed-mode/mixed-signal integrated circuit fabrication technology, and more specifically to a vertically stacked high electron mobility transistor (HEMT)-heterojunction bipolar transistor (HBT) integrated circuit and method of fabrication.

2. Description of the Related Art

Mixed-mode or mixed-signal devices take advantage of the different characteristics of field effect transistors (FETs) and bipolar transistors to achieve circuit functions and performance levels that are not currently achievable with existing single-device technologies. HEMTs have very low noise and high current gain characteristics which make them well suited for detecting faint signals. However, HEMTs are highly nonlinear and thus cannot operate over a large dynamic range. On the other hand, HBTs are relatively noisy but highly linear, and thus are well suited for the amplification of large signals. As a result, the two types of devices can be combined to form a low noise amplifier (LNA), with the HEMT providing the front end receiver and the HBT a highly linear output amplifier stage. Furthermore, known analog or digital bipolar circuit configurations can be used to control a HEMT amplifier. For example, an HBT circuit can be used to regulate the current in the HEMT amplifier.

One known approach is to fabricate separate HEMT and HBT integrated circuits that perform respective amplification and biasing functions, bond them to a carrier, and then interconnect their pins using conventional wire bonding techniques to produce the desired mixed-mode/mixed-signal circuit configuration. The advantage of this approach is that the fabrication of single-device integrated circuits is well known. However, the mixed-mode/mixed-signal circuit is not a monolithic integrated circuit, with its attendant cost and performance advantages. Wire bonding of the separate single-device circuits is labor intensive and expensive, and requires a large spacing between the devices. Moreover, it adds resistance to the circuit which lowers its speed, and unshaped wires produce undesirable capacitive and/or inductive effects and impedance matching problems at microwave and millimeter wave frequencies.

Streit et al., "Monolithic HEMT-HBT Integration by Selective MBE," *IEEE Transactions on Electron Devices*, vol. 42, No. 4, pages 618–623, 1995 discloses a selective growth process for integrating a Schottky-gate HEMT and an HBT in a monolithic microwave integrated circuit (MMIC). First, a GaAs substrate is placed in a chamber and a multi-layer npn-HBT structure is grown on the substrate using a molecular beam epitaxy (MBE) process. The substrate is removed from the chamber and patterned to roughly define the HBT device. The patterning process includes depositing a layer of silicon nitride on the HBT structure, depositing a mask over the silicon nitride, and plasma etching the exposed silicon nitride with chlorine-fluoride gas to selectively remove the silicon nitride and define the HBT device. The silicon nitride patterning process is expensive and time consuming.

The substrate is then put back into the chamber for a second MBE growth to produce the multi-layer HEMT structure, followed by etching the substrate with hydrofluoric acid to remove the remaining silicon nitride from the HBT structure. The compositions of the multi-layer HBT and HEMT structures are selected to optimize their respective performances. Thus, the materials and thicknesses of the individual layers are not the same. Once both the HBT and HEMT structures are formed, they are patterned and metallized using conventional etching and deposition processes, respectively, to define the devices' active areas and metal contacts. This includes a trench etch through the HEMT structures to define their Schottky barriers. The trench etch is difficult to control, and thus reduces the HEMT uniformity across the wafer.

Although Streit's HEMT-HBT is integrated, and thus realizes the advantages of integrated circuits, it has a number of serious deficiencies. The growth and regrowth of the HBT and HEMT structures increases fabrication time, which increases the cost of the IC. When the substrate is removed from the chamber between growths for processing it can become contaminated, which reduces the quality of the HEMT material grown in the regrowth stage. Furthermore, during regrowth the HEMT material tends to build up along the edge adjacent the HBT structure. As a result, the periphery of the HEMT can be of poor quality and unusable as a part of the HEMT's active area. This increases the spacing between devices, which reduces the number of devices that can be fabricated on a wafer. The regrowth process also exposes the device to temperatures in excess of 600° C., which causes dopants in the highly doped base region to diffuse into the emitter and collector regions, thereby reducing the abruptness of the pn junctions and lowering the HBT's current gain.

Streit's growth and regrowth process produces HEMT and HBT devices that are non-planar, i.e., they have large step discontinuities between their metal contacts. This occurs because the two devices are fabricated in independent growths and thus cannot be exactly matched, they have different multi-layer structures to optimize their performances, and the HEMT structure builds up near the HBT during regrowth. As a result, the potential for gaps in the metal interconnections formed through conventional deposition processes is high and the chance that metal will be deposited where it is not wanted is also high. This reduces the reliability of the HEMT-HBT device. Furthermore, thicker metal interconnections are required to reduce the chance of breakage due to the step discontinuities, which increases the weight of the device.

Zampardi et al. "Circuit Demonstrations in GaAs BiFET Technology," *Solid-State Electronics*, Vol. 38, No. 9, pp. 1723–1726, 1995 disclose a Schottky-gate MESFET-HBT integrated circuit. The MESFET and HBT share only a single layer: the MESFET's channel and the HBT's emitter. In order to provide the necessary HBT emitter characteristics, Zampardi uses aluminum gallium arsenide (AlGaAs), which provides poor channel mobility for the MESFET.

Usagawa et al., (fill in title) *IEDM*, pp 78- (fill in page range), 1987 discloses an integrated pnp-HBT/HEMT in which the devices share a single layer: the HEMT's channel and the HBT's base. The shared layer includes a two dimensional electron gas that is necessary to provide the high electron mobility in the HEMT. The gas layer is very thin, and thus the HBT's base is susceptible to "punch-through" when reverse biased under a large electric field. This can destroy the HBT's bipolar operation. Furthermore, the pnp-HBT is very slow, due to the low mobility of holes with respect to that of electrons.

SUMMARY OF THE INVENTION

The invention is directed to integrated circuits which combine HEMTs, HBTS, passive devices and interconnect metallization on a single substrate, and to methods of producing such circuits. It is particularly suited to the production of MMICs.

In a preferred embodiment a HEMT layer, a buffer layer and an HBT layer are built up over a very smooth substrate surface. HEMT devices are located atop substrate mesas which are of approximately the same thickness as the total of the HEMT and buffer layers. Therefore, the HEMT devices are substantially coplanar with the HBT devices. A preferred embodiment of an RF receiver employs such mixed-mode devices to combine a low noise amplifier built around an HEMT device with other receiver circuits employing HBT devices in an integrated circuit (IC).

In a preferred method of producing the IC, a substrate is first patterned, using a dry etching process, to produce mesas in the substrate material at locations which will eventually support HEMT devices. The height of these mesas is substantially equal to the height of the HEMT stack which will be grown on the substrate. The dry etch yields a very smooth substrate surface. After patterning, HEMT and HBT stacks are grown over the substrate, using molecular beam epitaxy (MBE). The smooth-surfaced substrate yields smooth HEMT and HBT stacks which, due to their relative smoothness, permit high level integration, e.g., the incorporation of many HEMT and HBT devices on a single substrate.

After the substrate is patterned HEMT and HBT layers are grown in a single growth step, i.e., no sequential growth, processing and regrowth is necessary. The device stack is formed by growing: a HEMT layer, including a stack of several sublayers, on the substrate; a buffer layer on the HEMT layer; then a HBT layer (also including a stack of several sublayers) on top of the buffer layer. The entire device stack is grown using MBE with a single growth sequence. Those areas of epitaxial material which rest on the substrate mesas are, as mentioned above, the preferred locations for HEMT devices. The HBT regions are patterned with a photoresist, and the HBT (top) and buffer (middle) layers are etched to expose the HEMT stack in the mesa locations. The etch which exposes the HEMT stack stops on the top most GaInAs contact layer of the HEMT. In the preferred embodiment the etch is a two step process, with a first step removing the HBT layer and the second etch step, using a different etch material, removing the buffer layer down to the HEMT cap layer. After exposure in this manner, the HEMT devices are preferably processed and then tested. If they pass, the HBT devices are then processed and tested. Following successful testing of the HBT devices, passive devices are formed, the IC is planarized and electrical interconnections are formed.

These and other features, aspects and advantages of the invention will be apparent to those skilled in the art from the following detailed description, taken together with the accompanying drawings.

DETAILED DESCRIPTION OF THE INVENTION

In the preferred embodiment new mixed-device integrated circuits include vertically stacked HEMT and HBT devices which are formed on a single, mesa patterned substrate. An HEMT stack is grown on the substrate, followed by buffer and then HBT layers. Unlike conventional processes which grow, process and re-grow, the entire stack is produced in a single growth step. In those areas where HEMT devices are processed, the HEMT layers are brought to the same level as the HBT devices with a dry etch to form mesas in the underlying substrate. Since the HEMT and HBT device layers are substantially coplanar, the interconnection between such devices may be much more reliable than interconnection between devices which are not coplanar. The process of producing the new vertically stacked devices is modular in that, once the HEMT devices have been fabricated they may be tested before any further processing steps are taken. In this way the fabrication method ensures that no further process steps are wasted on an IC with defective HEMTs. Tests are conducted again at the end of HBT processing so that no further processing is conducted on an IC having defective HBTs.

Figure 1:
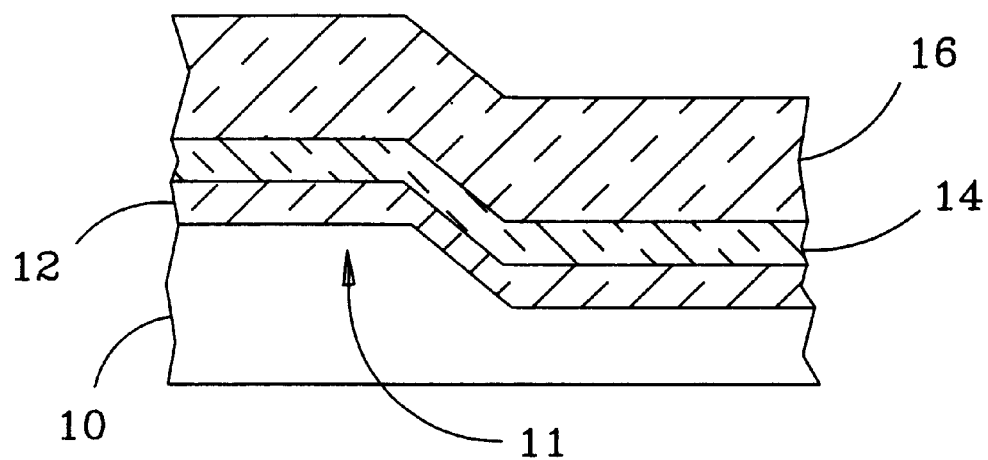
FIG. 1 is a sectional view of an IC, illustrating the relationship of various device layers to one another in a preliminary stage of processing according to the invention.

FIG. 1 illustrates the basic vertically stacked layers of the new mixed-device IC. A semi-insulating (S.I.) InP layer forms the IC substrate 10. Although the substrate 10 is originally of a uniform thickness, a portion of the substrate is etched away in an area where no HEMT device is to be processed, yielding a mesa 11. The preferred etching material is a plasma of the gases $CH_4, H_2, Ar$ which yields a very smooth surface, i.e., having a typical surface variation of only 200 Å, peak to valley. Other etches produce much rougher surfaces, with the roughness visible at only 500× magnification. The smooth surface produced by the dry etch is present both on and off the mesa 11 and permits high levels of device integration. $Si_3N_4$ is the preferred masking material for the dry etch.

HEMT layers 12, a buffer layer 14 and HBT layers 16 are sequentially grown over the substrate 10. Although MBE is the preferred process for this growth, it is relatively slow and costly and alternative processes such as metal organic chemical vapor deposition (MOCVD), also known as organic metal vapor phase epitaxy (OMVPE), may be employed to produce the stack in a single growth process. The mesa 11 is formed so that its outermost surface is substantially aligned with the bottom surface of the HBT layer 16. A more detailed description of the composition of the basic layers 10, 12, 14, 16 is set forth in connection with FIG. 3.

Figure 2:
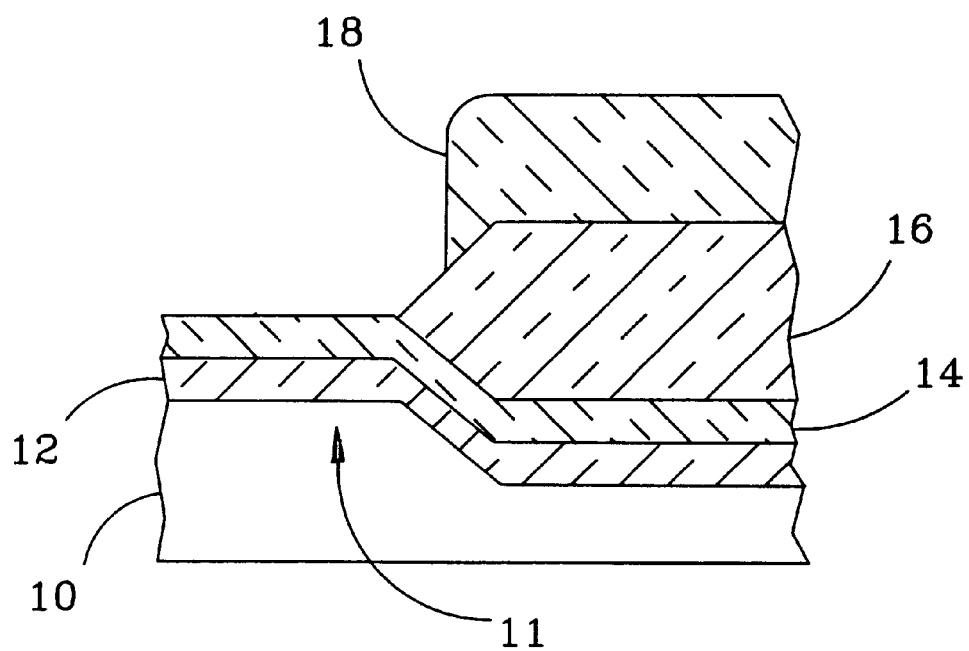
FIG. 2 is a sectional view of the IC at a subsequent processing stage.

After patterning the substrate 10 and growing the layers 12, 14, 16, a photoresist 18 is deposited as illustrated in FIG. 2 on those areas of the IC where no HEMT devices are to be formed. A citric acid-based etch is then used to remove the HBT layer from those areas lacking photoresist. When the SI AlInAs buffer layer 14 is reached, this etch is terminated. Since buffer layer 14 is characterized by a very high surface breakdown in the citric etch, it is relatively easy to determine when it has been reached. In the preferred embodiment, the buffer layer 14 is approximately 2000 Å thick. Therefore, it is relatively easy to stop the etch on or within the buffer layer 14. After stopping the citric etch, another etchant, that does not etch the outermost layer of the HEMT stack is used to remove the remaining buffer material. The second etch employs a selective etchant, preferably hydrochloric acid-based, which etches the buffer layer 14 but not the HEMT layer 12. Since, as will be described in greater detail in connection with FIG. 3, the top sublayer of the HEMT stack is only 70 Å thick, it is imperative to terminate the etching process immediately upon reaching it.

Figure 3:
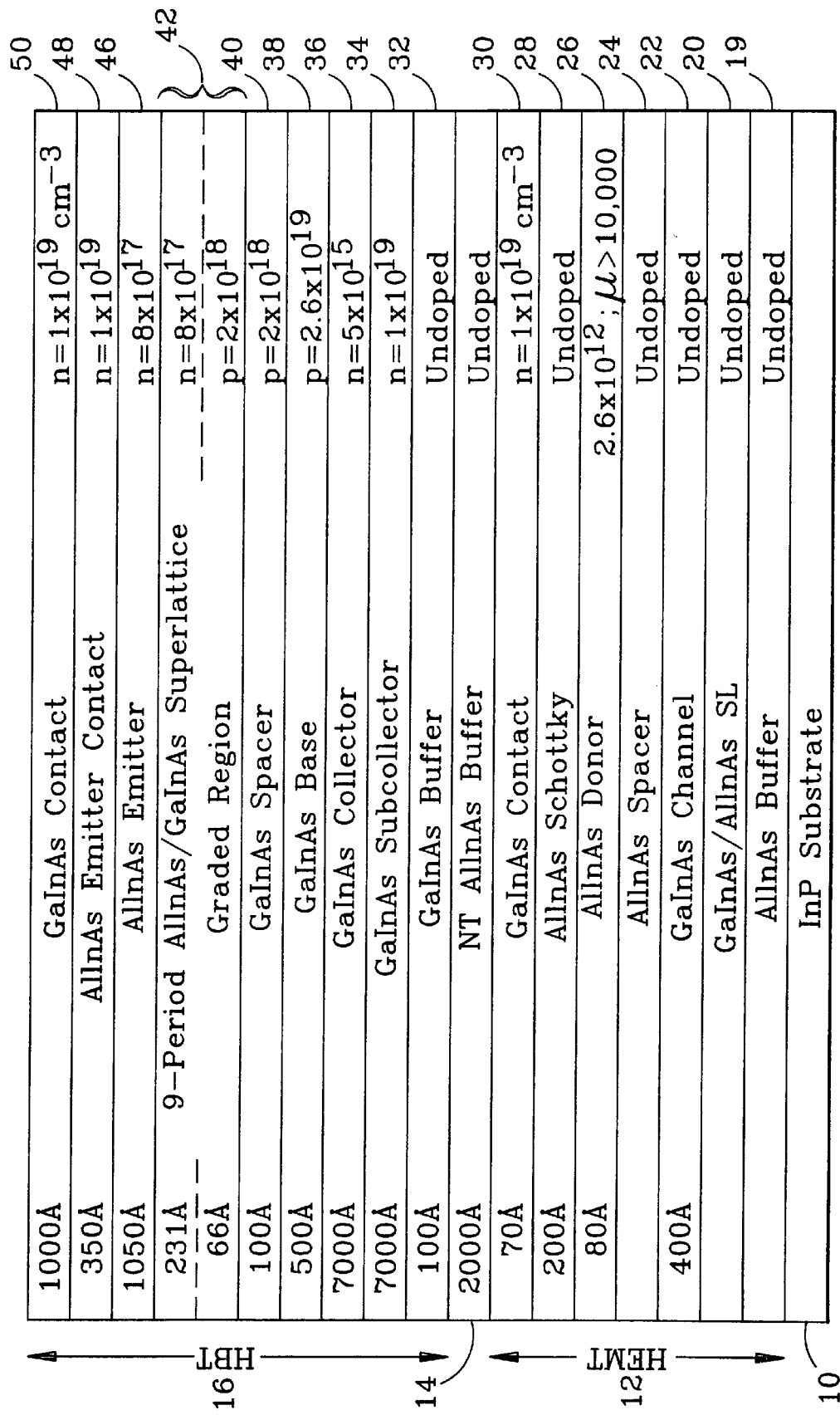
FIG. 3 is a diagram of the IC illustrating the various layers within the HEMT and HBT stacks.

FIG. 3 depicts, in greater detail, the various sublayers included in the HEMT and HBT of the preferred embodiment. The HEMT stack 12 preferably includes a buffer layer 19 of undoped AlInAs upon the SI InP substrate 10. The buffer layer 19 further smoothes the surface upon which the remainder of the stack is formed. This layer is followed by a thick superlattice layer 20 of undoped GaInAs/AlInAs and a 400 Å thick channel layer 22 of GaInAs, both undoped. A thin undoped layer of AlInAs acts as a spacer 24 between an overlying 80 Å AlInAs donor layer 26 and the underyling channel layer 22, and reduces dislocations between the layers 26 and 22. The HEMT's two dimensional electron gas is formed at the interface between channel layer 22 and spacer layer 24. The donor layer 26 is doped to a concentration of approximately 2.6 E12 $cm^{-3}$, where E12 denotes ten to the twelfth power. A 200 Å Schottky layer 28 of undoped AlInAs follows, and then an n-type 70 Å layer of GaInAs, doped to 1E19 $cm^{-3}$ which forms a top contact layer 30. The undoped buffer layer 14, as noted above, acts as a buffer layer between the HEMT 12 and HBT 16 stacks.

The HBT stack is grown directly over the buffer layer 14 and includes a 100 Å undoped GaInAs buffer layer 32, followed by a 7000 Å GaInAs n-type subcollector layer 34 doped to a concentration of 1E19 $cm^{-3}$ and a 7000 Å GaInAs n-type collector layer 36 doped to a concentration of 5E15 $cm^{-3}$. The HBT's base material is a 500 Å thick layer 38 of 2.6E19 $cm^{-3}$ p-type GaInAs, followed by a 100 Å spacer layer 40 of 2E18 $cm^{-3}$ p-type GaInAs. The HBT's heterojunction 42 is formed by an AlInAs/GaInAs superlattice graded region consisting of nine periods of alternating p-type (2E18$cm^{-3}$) GaInAs and n-type (8E17$cm^{-3}$) AlInAs layers, with the GaInAs layers contracting from 231 Å thick at the spacer layer 40 interface to 66 Å at the opposite end of the superlattice; and the AlInAs layer thicknesses expanding by similar amounts as the GaInAs layers contract. The HBT's emitter 46 is formed on the heterojunction as a 1050 Å n-type 8E17 $cm^{-3}$ layer of AlInAs, followed by a 350 Å emitter contact layer 48 of n-type 1E19 $cm^{-3}$ AlInAs and finally a 1000 Å n-type 1E19 GaInAs contact layer 50.

Figure 4:
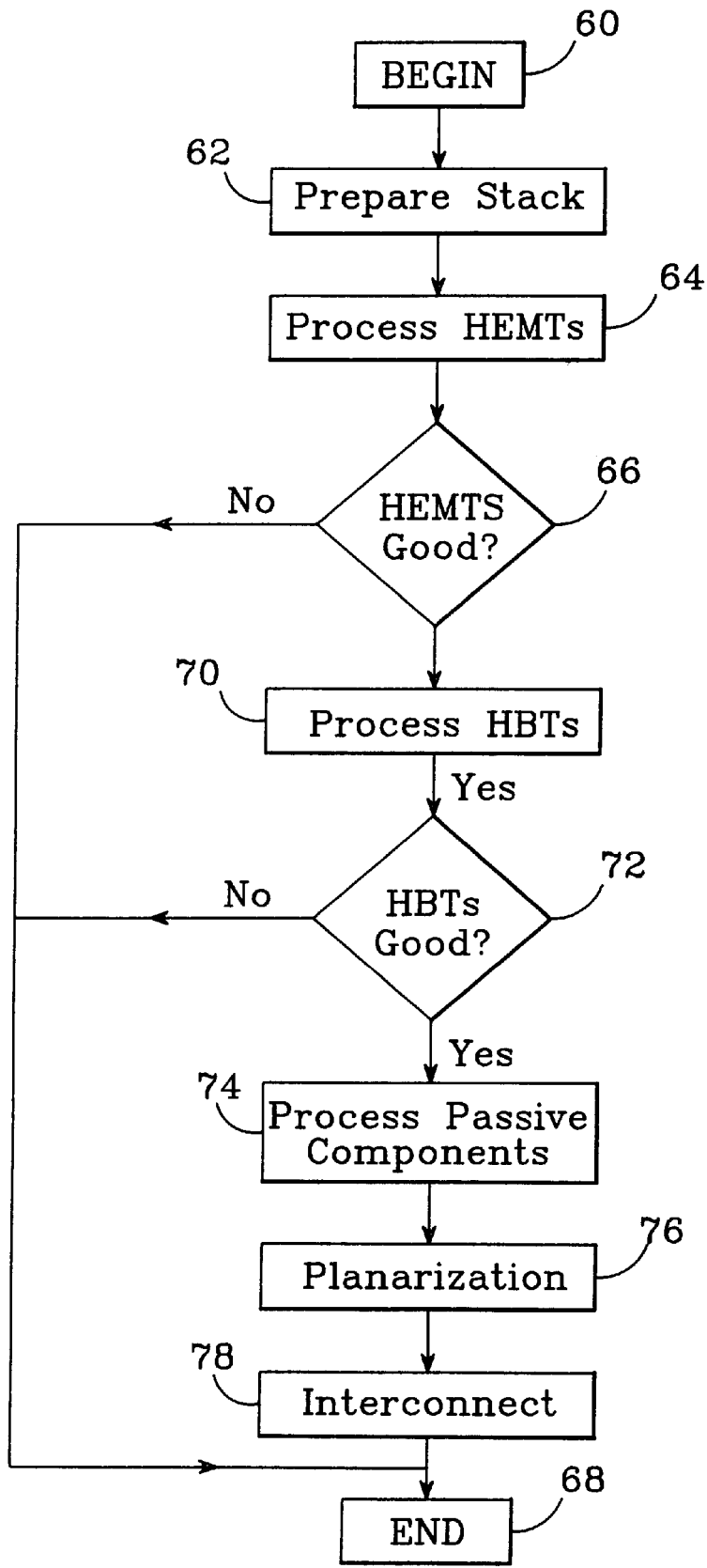
FIG. 4 is a flow chart of a new fabrication/test sequence for the new ICs.

The preferred IC production sequence is illustrated in the flow chart of FIG. 4. At the beginning of the process (step 60) the vertical stack illustrated in FIG. 1 is prepared (step 62). The stack is grown using a single-growth MBE process which, by its nature, avoids the contamination and high temperature re-exposure associated with conventional IC regrowth processes that degrade the IC's performance. The stack preparation step 62 includes a dry etch of the substrate 10 which yields the mesas 11 in areas where HEMT devices are to be produced. The preferred etching utilizes a plasma of $CH_4,H_2,Ar$ which yields a very smooth surface, with a surface variation of approximately 200 Å, peak to valley. This step also involves MBE growth of the HEMT stack 12, the buffer layer 14 and the HBT layer 16, patterning the IC with a photoresist and then performing the two-step etch to expose the HEMT stack in those areas where HEMT devices are to be formed.

Following the stack preparation of step 62, HEMT devices are processed in step 64. This includes the deposition of ohmic metal to form source and drain contacts, an isolation implant which isolates individual HEMTs from surrounding devices, and then an alloy to fully form ohmic contacts. The gate contacts are sculpted in photoresist by an electron beam to yield, in a preferred embodiment, a mushroom shaped gate contact structure, the narrower section of which is in contact with the device stack. Metal is evaporated onto the wafer into this sculpted pattern and lifted-off to leave the mushroom gate. A layer of $Si_3N_4$, which protects the HEMTs during subsequent HBT processing, is then formed over the HEMTs.

After the HEMT devices are processed, they are tested (step 66) with device parameters such as leakage current, pinchoff voltage, transconductance and maximum drain current measured and compared to specified values. This testing is a standard DC current-voltage characterization of the HEMTs. RF measurements can also be made at this point, provided the common but proper high frequency test structures have been fabricated. If the HEMTs do not meet minimum performance requirements, the process may be terminated at this point, proceeding to the final step END 68. If the HEMT devices are inadequate, the entire wafer will likely be discarded. Terminating the wafer processing at this step therefore eliminates considerable wasted time, effort and equipment usage when compared to conventional processing, since conventional processing would proceed until all processing steps were complete, including HBT processing, etc, before testing.

On the other hand, if the HEMTs perform satisfactorily, processing proceeds to step 70, in which the HBTs are processed. The HBT processing includes the deposition and etching of emitter, base and collector metal patterns, an isolation etch and an annealing step. After processing, the HBTs are tested in step 72 for parameters such as current gain, current gain linearity, breakdown voltage, leakage current, etc. If the HBTs are inadequate, processing proceeds to step 68 END. Should the HBT devices prove inadequate, termination at this point avoids further fruitless process steps.

Should the HBTs prove adequate, processing proceeds to step 74 in which passive components, e.g., resistors and capacitors, are formed. In a preferred embodiment $Si_3N_4$ is deposited, followed by TaN resistors. A first layer of capacitor metallization is layed down, followed by a $Si_3N_4$ dielectric layer, and then the capacitors' top metallization. The capacitors are then exposed to a nitride etch. After the desired passive components have been formed the processing proceeds to step 76, in which the entire wafer is planarized using a polyimide coating.

In the next step 78 vias are etched into the polyimide to provide access to the terminals of the underlying HEMT, HBT and passive devices. A layer of metallization is then routed over the polyimide to interconnect, individual components through the vias. Since the entire wafer is substantially co-planar, i.e., HEMT and HBT devices are at approximately the same level, this layer of metallization may be routed over the HBT and HEMT devices. At this point individual circuits may be tested. In a large-scale integration embodiment a polyimide coating is applied to the wafer following such tests, vias are etched into the polyimide and a third level of metallization is patterned to interconnect various ICs sharing the substrate. In a preferred embodiment such a large-scale integration technique is employed to produce a monolithic receiver which incorporates a low noise amplifier, a mixer/amplifier and an analog to digital converter on a single substrate.

Figure 5:
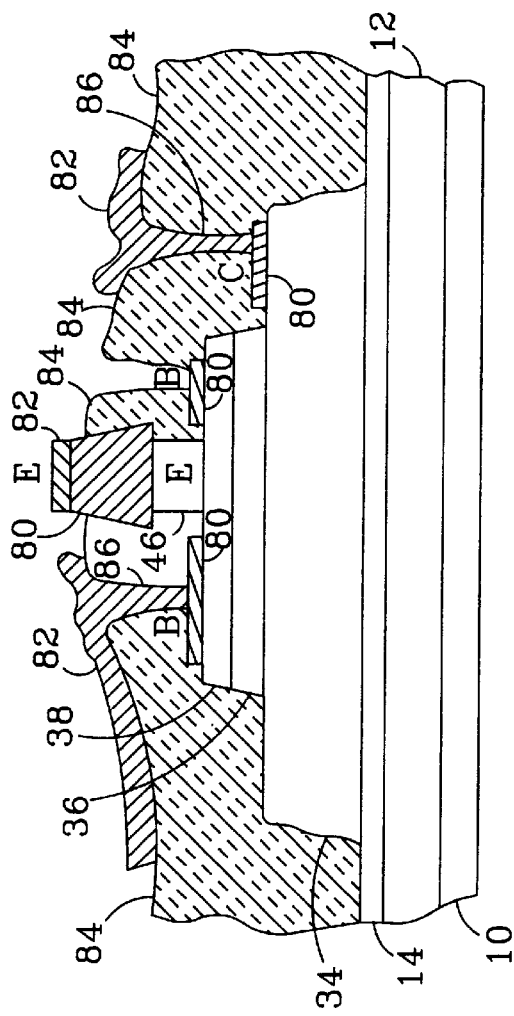
FIG. 5 is a detailed sectional view of an HBT device formed with the new process.

The sectional view of FIG. 5 illustrates the various layers of an HBT formed in the above manner. The InP substrate 10, HEMT stack 12 and buffer 14 are as described in connection with to FIG. 3. The HBT's subcollector 34 resides atop the buffer layer 14, followed by the collector 36, base 38 and emitter 46. Metal contacts 80 connect the HBT's emitter, base and collector to other circuit components through metallization 82 formed on a polyimide planarization layer 84. Vias 86 are formed in the polyimide layer to provide access to the base and collector contacts 80.

Figure 6:
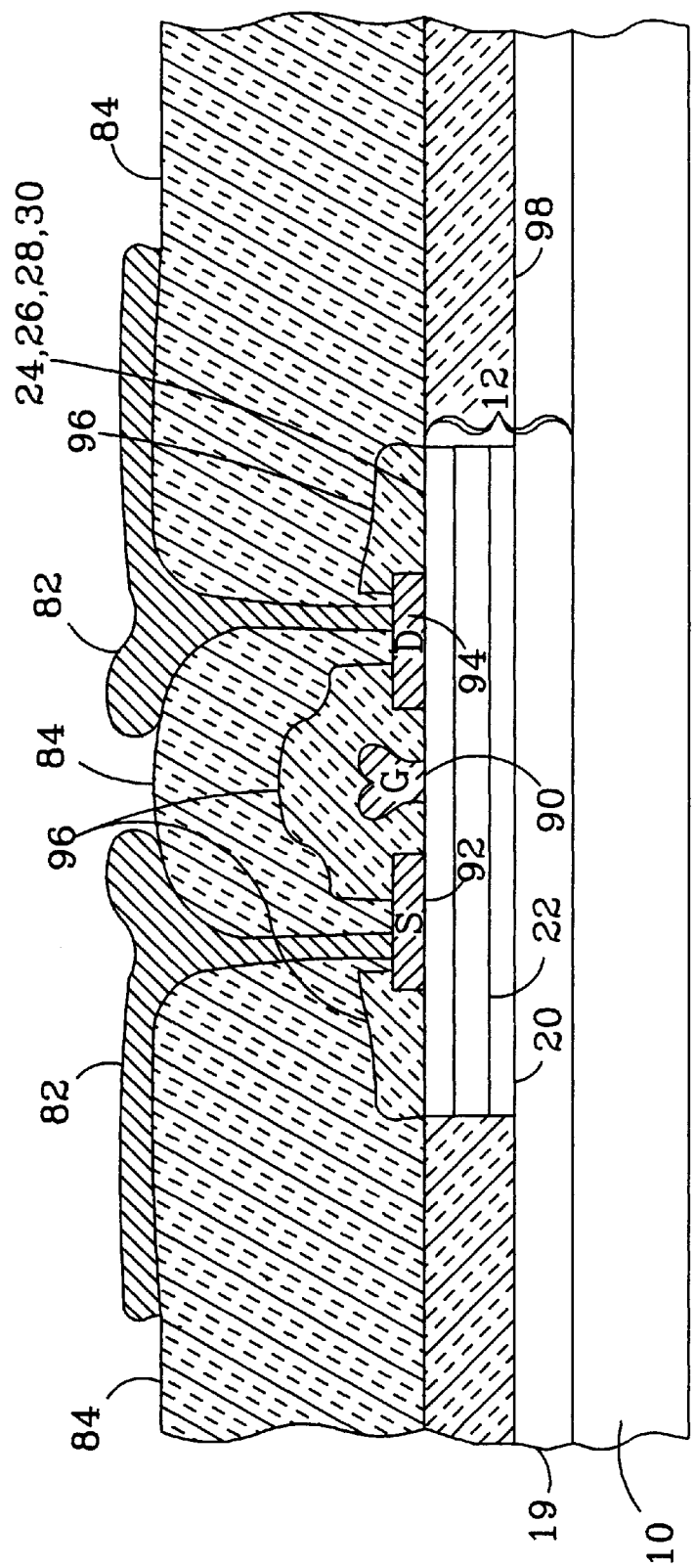
FIG. 6 is a detailed sectional view of an HEMT device formed with the new process.

As illustrated in FIG. 6, gate, source and drain contacts 90, 92 and 94, respectively, are formed on the HEMT stack 12. A protective layer 96 of $Si_3Ni_4$ is formed after the HEMT processing to protect the HEMT from subsequent processing steps such as the HBT fabrication. An isolation region 98 surrounding the HEMT devices is implanted to isolate the HEMT from surrounding devices. The polyimide planarization layer 84 and metallization 82 are as described in connection with FIG. 5; a metallized connection to the gate contact 90 is brought out perpendicular to the sheet and is not shown in FIG. 6.

Figure 7:
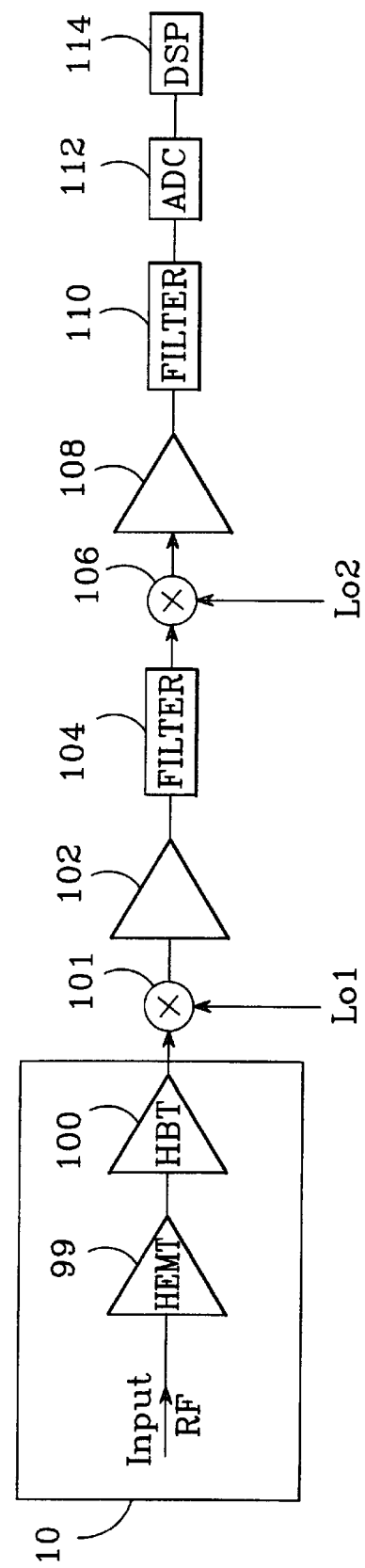
FIG. 7 is a block diagram of an RF receiver which employs the new HBT/HEMT mixed device technology.

The HBT and HEMT devices may be combined to produce an integrated circuit receiver, as illustrated in the electrical schematic diagram of FIG. 7. An input amplifier 99 employs a HEMT to provide low noise amplification of an input RF signal labeled INPUT RF. A linear amplifier 100, employing HBTs, amplifies the received signal further and the amplified signal is combined in a mixer 101 with a signal from a local oscillator L01. The resultant signal is passed to another amplifier 102 where it is amplified and routed to a filter 104. The filtered signal is sent to a mixer 106, where it is mixed with a signal from another local oscillator L02. The resultant signal is amplified by an amplifier 108, filtered by a filter 110 and passed to an analog-to-digital converter (ADC) 112. The digital signal from the ADC is supplied to digital signal processing circuitry 114 for further processing. At least the amplifiers 99 and 100, and preferably the entire receiver, is integrated on the single substrate 10.

The foregoing description of specific embodiments of the invention has been presented for the purposes of illustration and description, and numerous variations and alternate embodiments are possible within the scope of the invention. It is intended that the scope of the invention be limited only by the appended claims.

We claim:

1. A method of producing a mixed HEMT/HBT integrated circuit on a common substrate, comprising the steps of:

forming a substrate with a first surface and a mesa surface that is elevated from said first surface, growing HEMT layers over said substrate, a buffer layer over said HEMT layers and HBT layers over said buffer layer, with a first etchant, etching said HBT layers from an HEMT portion of said HEMT layers that overlies said mesa surface, with a second etchant, etching said buffer layers from said HEMT portion, adding source, gate and drain contacts to said HEMT portion to define and provide access to an HEMT, depositing a protective layer over said HEMT, and adding emitter, base and collector contacts to an HBT portion of said HBT layers that overlies said first surface to define and provide access to an HBT.

2. The method of claim 1, further comprising the step of etching said substrate to produce a smooth surface for the growth of said HEMT layers.

3. The method of claim 2, wherein said etching step is performed with a dry etchant.

4. A method of producing a mixed HEMT/HBT integrated circuit on a common substrate, comprising the steps of:

A) growing a multilayer device stack which includes HEMT layers over a substrate, a buffer layer over said HEMT layers and HBT layers over said buffer layer, B) removing said HBT and buffer layers from an HEMT portion of said HEMT layers, C) adding source, gate and drain contacts to said HEMT portion to define and provide access to an HEMT, D) depositing a protective layer over said HEMT, and E) adding emitter, base and collector contacts to define and provide access to an HBT in a remaining portion of said HBT layers;

wherein step B includes a first etch to remove said HBT layers down to said buffer layer between said HBT and HEMT layers, and a second etch to remove said buffer layer from said HEMT portion and thereby expose said HEMT layers.

5. The method of claim 4, wherein a mesa is formed in the substrate, and said HEMT is formed on the mesa.

6. The method of claim 4, wherein said first etch employs a citric-based etchant to remove said HBT layers.

7. The method of claim 6, wherein said second etch employs an Hcl/H2O etchant to remove said buffer layer.

8. The method of claim 4, further comprising the step of laying down a planarizing layer over said HEMT and said HBT.

9. The method of claim 8, further comprising the step of establishing a metallized interconnection for said HEMT and HBT over said planarizing layer.

10. The method of claim 9, further comprising the step of forming additional circuitry on said substrate and interconnecting it with said HEMT and HBT.

11. The method of claim 1, wherein said buffer layer has a buffer surface in contact with said HBT layers and said forming step is adjusted to substantially align said mesa surface and said buffer surface.

12. The method of claim 1, further including the steps of:

covering said HEMT and said HBT with a polyimide coat;

forming vias through said polyimide coat to provide access to said HEMT and said HBT; and depositing metals through said vias to contact said HEMT and said HBT.

13. The method of claim 1, wherein said first etchant is a citric-based etchant.

14. The method of claim 1, wherein said second etchant is an Hcl/H2O etchant.

* * * * *